United States Patent
Umeda et al.

(10) Patent No.: US 9,972,769 B2
(45) Date of Patent: May 15, 2018

(54) PIEZOELECTRIC THIN FILM AND METHOD FOR MANUFACTURING THE SAME, AND PIEZOELECTRIC ELEMENT

(71) Applicants: Murata Manufacturing Co., Ltd., Nagaokakyo-shi, Kyoto-fu (JP); NATIONAL INSTITUTE OF ADVANCED INDUSTRIAL SCIENCE AND TECHNOLOGY, Chiyoda-ku, Tokyo (JP)

(72) Inventors: Keiichi Umeda, Nagaokakyo (JP); Atsushi Honda, Nagaokakyo (JP); Morito Akiyama, Tosu (JP); Toshimi Nagase, Tosu (JP); Keiko Nishikubo, Tosu (JP); Masato Uehara, Tosu (JP)

(73) Assignees: MURATA MANUFACTURING CO., LTD., Nagaokakyo-Shi, Kyoto-Fu (JP); NATIONAL INSTITUTE OF ADVANCED INDUSTRIAL SCIENCE AND TECHNOLOGY, Chiyoda-Ku, Tokyo (JP)

( * ) Notice: Subject to any disclaimer, the term of this patent is extended or adjusted under 35 U.S.C. 154(b) by 324 days.

(21) Appl. No.: 14/732,988

(22) Filed: Jun. 8, 2015

(65) Prior Publication Data
US 2015/0357555 A1 Dec. 10, 2015

(30) Foreign Application Priority Data
Jun. 9, 2014 (JP) .................................. 2014-118603

(51) Int. Cl.
*H01L 41/187* (2006.01)
*H01L 41/316* (2013.01)
*H01L 41/08* (2006.01)
*C23C 14/06* (2006.01)
*C23C 14/34* (2006.01)
*H03H 3/02* (2006.01)
*H03H 9/02* (2006.01)

(52) U.S. Cl.
CPC ........ *H01L 41/316* (2013.01); *C23C 14/0641* (2013.01); *C23C 14/3464* (2013.01); *H01L 41/0815* (2013.01); *H01L 41/187* (2013.01); *H03H 3/02* (2013.01); *H03H 9/02031* (2013.01)

(58) Field of Classification Search
CPC ........ H01L 41/16; H01L 41/18; H01L 41/187
USPC ........................ 310/358; 252/62.9 R, 62.9 PZ
See application file for complete search history.

(56) References Cited

U.S. PATENT DOCUMENTS

2013/0049544 A1   2/2013 Yokoyama
2013/0241673 A1*  9/2013 Yokoyama ......... H03H 9/02015
                                             333/189

FOREIGN PATENT DOCUMENTS

JP    2013-46111 A    3/2013
JP    2013-219743 A   10/2013

OTHER PUBLICATIONS

Tsuyoshi Yokoyama, et al., "Highly piezoelectric co-doped AlN films for bulk acoustic wave resonators", Ultrasonic Symposium (IUS), 2013 IEEE International, 2013, pp. 1382-1385.

* cited by examiner

*Primary Examiner* — Derek Rosenau
(74) *Attorney, Agent, or Firm* — Arent Fox LLP

(57) ABSTRACT

A piezoelectric thin film comprising aluminum nitride containing magnesium and hafnium, wherein a content of the hafnium based on 100 atomic % of the magnesium is 8 atomic % or more and less than 100 atomic %, and a total content of the magnesium and hafnium based on a sum of a (Continued)

content of the magnesium, hafnium, and aluminum is in a range of 47 atomic % or less.

13 Claims, 7 Drawing Sheets

PIEZOELECTRIC THIN FILM AND METHOD FOR MANUFACTURING THE SAME, AND PIEZOELECTRIC ELEMENT

BACKGROUND OF THE INVENTION

Field of the Invention

The present invention relates to a piezoelectric thin film and a method for manufacturing the piezoelectric thin film, and a piezoelectric element comprising the above piezoelectric thin film and first and second electrodes.

Description of the Related Art

Conventionally, a piezoelectric thin film comprising aluminum nitride containing scandium has been known to exhibit a high piezoelectric constant. On the other hand, scandium has been very expensive and has also been difficult to stably obtain. Therefore, aluminum nitride containing an element other than scandium has been widely researched.

For example, the following Patent Literature 1 discloses a piezoelectric thin film comprising an aluminum nitride film containing a divalent element and a tetravalent element, or an aluminum nitride film containing a divalent element and a pentavalent element. Patent Literature 1 shows the simulation results of the piezoelectric constant and the like of a piezoelectric thin film containing 14 aluminum atoms, 1 divalent element, 1 tetravalent element, and 16 nitrogen atoms.

Patent Literature 1: Japanese Patent Laid-Open No. 2013-219743

However, in the simulation in Patent Literature 1, it is assumed that an ideal atomic model can be formed, and therefore, the results are often not as simulated. Actually, problems relating to the solubility limits of the atoms, structural stability and the like occur. In addition, Patent Literature 1 only shows the simulation results for the particular composition as described above. Therefore, a composition that exhibits a higher piezoelectric constant and can be subjected to practical use cannot be known from the simulation results in Patent Literature 1.

SUMMARY OF THE INVENTION

It is an object of the present invention to provide a piezoelectric thin film containing inexpensive elements other than scandium and having excellent piezoelectric properties and a method for manufacturing the piezoelectric thin film, and a piezoelectric element comprising the piezoelectric thin film.

The inventors of this application have studied diligently and, as a result, found that the above object can be achieved by limiting the content of hafnium and the total content of magnesium and hafnium in a piezoelectric thin film formed of aluminum nitride containing magnesium and hafnium to particular ranges, thereby making the present invention.

Specifically, a piezoelectric thin film according to the present invention is a piezoelectric thin film formed of aluminum nitride containing magnesium and hafnium, wherein a content of the above hafnium based on 100 atomic % of the above magnesium is in a range of 8 atomic % or more and less than 100 atomic %, and a total content of the above magnesium and hafnium based on a sum of a content of the above magnesium, hafnium, and aluminum is in a range of 47 atomic % or less.

In the piezoelectric thin film according to the present invention, preferably, the content of the above hafnium based on 100 atomic % of the above magnesium is in a range of 26 atomic % or more and 85 atomic % or less.

In the piezoelectric thin film according to the present invention, preferably, the total content of the above magnesium and hafnium based on the sum of the content of the above magnesium, hafnium, and aluminum is in a range of 17 atomic % or more and 38 atomic % or less.

In a broad aspect, a method for manufacturing a piezoelectric thin film according to the present invention is a method for manufacturing the above piezoelectric thin film, comprising forming a film by a ternary sputtering method using a first target comprising aluminum, a second target comprising magnesium, and a third target comprising hafnium.

In another broad aspect, the method for manufacturing a piezoelectric thin film according to the present invention is a method for manufacturing the above piezoelectric thin film, comprising forming a film by a unitary sputtering method using a target comprising an alloy of aluminum, magnesium, and hafnium.

A piezoelectric element according to the present invention comprises the above piezoelectric thin film; and first and second electrodes provided so as to be in contact with the above piezoelectric thin film.

The piezoelectric thin film according to the present invention is formed of aluminum nitride containing magnesium and hafnium at a particular ratio and therefore can be manufactured more inexpensively than an aluminum nitride film containing scandium.

In addition, in the piezoelectric thin film according to the present invention, the content of magnesium and hafnium is limited to a particular range, and therefore, the piezoelectric properties are excellent.

DETAILED DESCRIPTION OF THE PREFERRED EMBODIMENTS

Embodiments of the present invention will be described below with reference to the drawings.

(Piezoelectric Thin Film)

A piezoelectric thin film according to the present invention is formed of aluminum nitride (AlN) containing magnesium (Mg) and hafnium (Hf). The above AlN containing Mg and Hf is formed by replacing the Al of AlN by Mg and Hf.

The content of the above Hf based on 100 atomic % of the above Mg is in the range of 8 atomic % or more and less than 100 atomic %, and the total content of the above Mg and Hf based on the sum of the content of the above Mg, Hf, and Al is in the range of 47 atomic % or less.

In this manner, in the present invention, the Al of AlN is replaced by Mg and Hf, and the content of Mg and Hf is in the above range. Therefore, a target can be manufactured more inexpensively than a piezoelectric thin film containing scandium (Sc), a rare element, and moreover, a piezoelectric thin film having excellent piezoelectric properties can be obtained.

The piezoelectric thin film according to the present invention will be more specifically described below with reference to FIG. 1 and FIG. 2.

Figure 1:
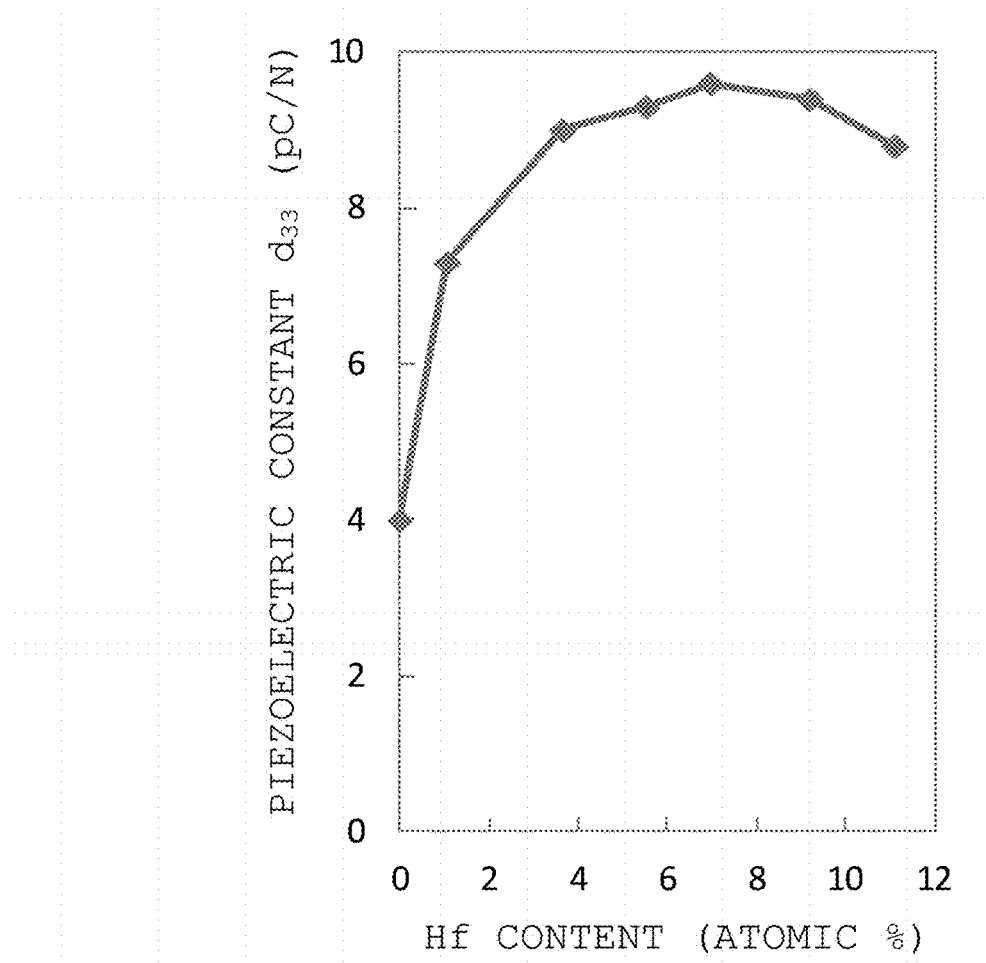
FIG. 1 is a diagram showing the relationship between the content of Hf and the piezoelectric constant $d_{33}$ when the content of Mg is fixed at 13 atomic % and the content of Hf is changed, in a piezoelectric thin film of aluminum nitride (AlN) containing magnesium (Mg) and hafnium (Hf)

FIG. 1 is a diagram showing the relationship between the content of Hf and the piezoelectric constant $d_{33}$ when the content of Mg is fixed at 13 atomic % and the content of Hf is changed, in a piezoelectric thin film of AlN containing Mg and Hf.

In other words, FIG. 1 is a diagram showing the relationship between the content of Hf and the piezoelectric constant $d_{33}$ when the value of X is changed in a piezoelectric thin film formed of $(Hf_X Mg_{0.13} Al_{1-0.13-X})N$.

In obtaining the graph in FIG. 1, piezoelectric thin films having different Hf content are formed by a ternary sputtering method described later under the following conditions using a target comprising Mg, a target comprising Al, and a target comprising Hf, and subjected to measurement.

Mg target power: 10 W
Al target power: 180 W
Hf target power: 0 W to 40 W
Sputtering pressure: 0.25 Pa
Substrate temperature: 400° C.
Ar:$N_2$ gas ratio: 60:40
Film formation time: about 4 hours From FIG. 1, it is seen that when the content of Hf based on a Mg content of 13 atomic % is 1.07 atomic % or more, that is, the content of Hf based on a Mg content of 100 atomic % is 8 atomic % or more, the piezoelectric constant $d_{33}$ of the piezoelectric thin film is 6.5 pC/N or more and is increased.

Further, when the content of Hf based on a Mg content of 13 atomic % is 3.4 atomic % or more and 11.1 atomic % or less, that is, when the content of Hf based on a Mg content of 100 atomic % is 26 atomic % or more and 85 atomic % or less, the piezoelectric constant $d_{33}$ of the piezoelectric thin film is 9.0 pC/N or more and is even more increased. Moreover, in this case, the piezoelectric constant $d_{33}$ is stable even if the Hf concentration fluctuates, and therefore, this case is more suitable for mass production.

Therefore, in the present invention, the content of Hf based on 100 atomic % of Mg is preferably in the range of 26 atomic % or more and 85 atomic % or less.

Figure 2:
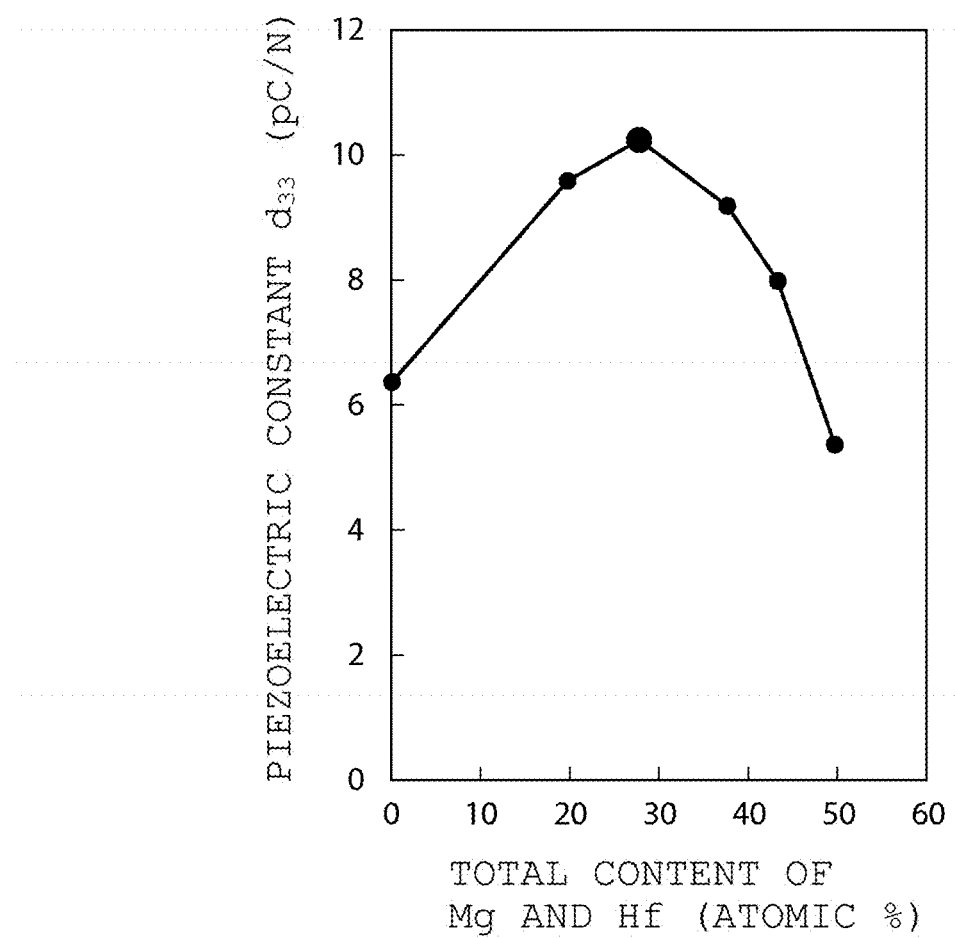
FIG. 2 is a diagram showing the relationship between the total content of Mg and Hf and the piezoelectric constant $d_{33}$ when the content ratio between Mg and Hf is fixed at 2:1 and the total content of Mg and Hf based on the sum of the content of Mg, Hf and aluminum (Al) is changed, in a piezoelectric thin film of aluminum nitride (AlN) containing magnesium (Mg) and hafnium (Hf)

FIG. 2 is a diagram showing the relationship between the total content of Mg and Hf and the piezoelectric constant $d_{33}$ when the content ratio between Mg and Hf is fixed at 2:1 and the total content of Mg and Hf based on the sum of the content of Mg, Hf, and Al is changed, in a piezoelectric thin film of AlN containing Mg and Hf.

In other words, FIG. 2 is a diagram showing the relationship between the total content of Mg and Hf based on the sum of the content of Mg, Hf, and Al and the piezoelectric constant $d_{33}$ when the value of Y is changed in a piezoelectric thin film formed of $(HfMg_2)_Y Al_{1-Y}$.

In obtaining the graph in FIG. 2, piezoelectric thin films having different Hf and Mg content are formed by a ternary sputtering method described later under the following conditions using a target comprising Mg, a target comprising Al, and a target comprising Hf, and subjected to measurement.

Mg target power: 0 W to 30 W
Al target power: 180 W
Hf target power: 0 W to 90 W
Sputtering pressure: 0.25 Pa
Substrate temperature: 400° C.
Ar:$N_2$ gas ratio: 60:40
Film formation time: about 4 hours From FIG. 2, it is seen that when the total content of Mg and Hf is 47 atomic % or less, the piezoelectric constant $d_{33}$ is 6.5 pC/N or more and is increased. Further, it is seen that when the total content of Mg and Hf is 17 atomic % to 38 atomic %, the piezoelectric constant $d_{33}$ is 9.0 pC/N or more and is even more increased, and when the total content of Mg and Hf is 28 atomic %, the piezoelectric constant $d_{33}$ is most increased.

Therefore, in the present invention, the total content of Mg and Hf based on the sum of the content of Mg, Hf, and Al is preferably in the range of 17 atomic % or more and 38 atomic % or less, and the total content of Mg and Hf is more preferably 28 atomic %.

From the above, in the present invention, when the content of the above Hf based on 100 atomic % of Mg is in the range of 8 atomic % or more and less than 100 atomic %, the piezoelectric constant $d_{33}$ is increased, and when the content of the above Hf based on 100 atomic % of Mg is in the range of 26 atomic % or more and less than 85 atomic %, the piezoelectric constant $d_{33}$ is even more increased.

In addition, when the total content of Mg and Hf based on the sum of the content of Mg, Hf, and Al is in the range of 47 atomic % or less, the piezoelectric constant $d_{33}$ is increased. When the total content of Mg and Hf is in the range of 17 atomic % or more and 38 atomic % or less, the piezoelectric constant $d_{33}$ is even more increased. When the total content of Mg and Hf is 28 atomic %, the piezoelectric constant $d_{33}$ is even more increased.

In this manner, the present invention has been made by the inventors of this application first finding, as a result of diligent study, a composition that can be subjected to practical use, which cannot be known from simulation based on first-principles calculation using an ideal crystal structure.

The piezoelectric constant $d_{33}$ of the piezoelectric thin film according to the present invention is increased as described above, and therefore, the fractional bandwidth of a resonator using the above piezoelectric thin film increases, and a broadband filter can be formed.

In addition, the resonant resistance of a resonator using the above piezoelectric thin film decreases, and therefore, an oscillator having excellent oscillation stability and low power consumption can be formed.

(Method for Manufacturing Piezoelectric Thin Film)

The piezoelectric thin film according to the present invention can be formed by a thin film formation method. Examples of the above thin film formation method include a sputtering method and a CVD method, but the piezoelectric thin film is preferably manufactured by a sputtering method. Particularly preferably, sputtering is performed using the ternary sputtering apparatus shown in FIG. 3 or the unitary sputtering apparatus shown in FIG. 4.

Figure 3:
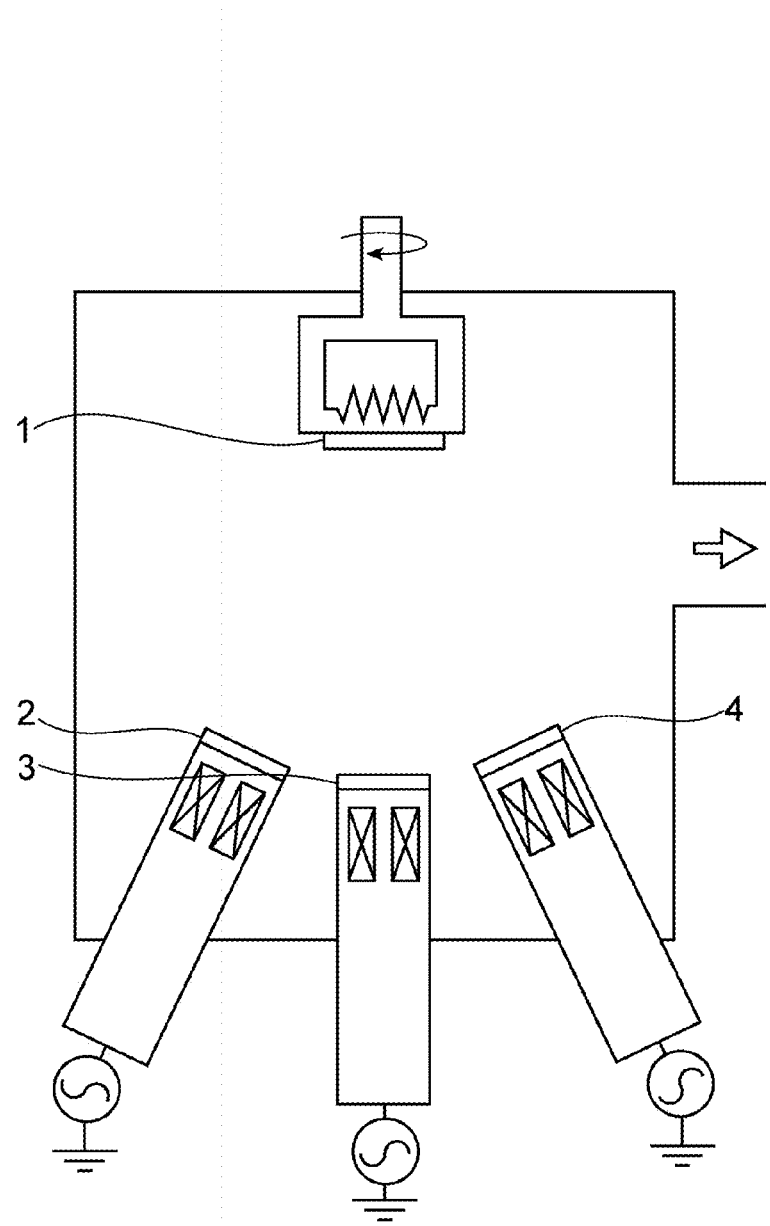
FIG. 3 is a simplified diagram of an apparatus used in forming a film by a ternary sputtering method.

In the sputtering apparatus shown in FIG. 3, a film is formed on a substrate 1 by a ternary sputtering method under a mixed atmosphere of nitrogen ($N_2$) gas and argon (Ar) gas using a first target 2 comprising Al, a second target 3 comprising Mg, and a third target 4 comprising Hf. A target comprising AlN may be used as the first target 2. In the ternary sputtering method, by changing the ratio between the first, second, and third target power, the content of Al, Mg, and Hf can be adjusted.

Figure 4:
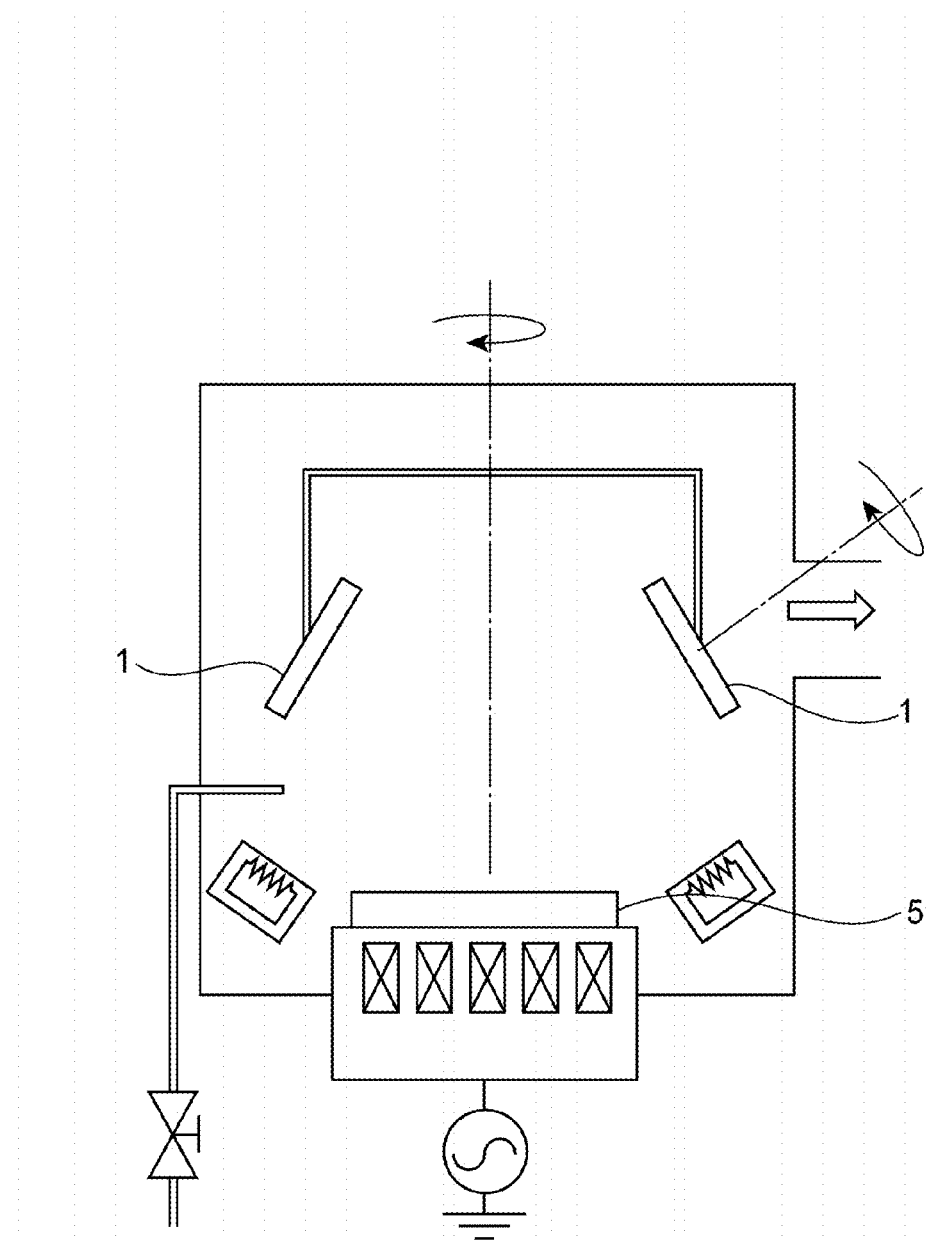
FIG. 4 is a simplified diagram of an apparatus used in forming a film by a unitary sputtering method.

In the sputtering apparatus shown in FIG. 4, a film is formed by a unitary sputtering method under a mixed atmosphere of $N_2$ gas and Ar gas using an alloy target 5 comprising an alloy of Al, Mg, and Hf. In the unitary sputtering method, by previously preparing the alloy targets 5 having different Al, Mg, and Hf content, the content of Al, Mg, and Hf can be adjusted. The alloy target 5 can be fabricated using a vacuum melting method, a sintering method, or the like. Alternatively, it is possible to place Mg and Hf metal pieces on an Al target, or make a depression in an Al target and embed Mg and Hf metal pieces.

In addition, in the unitary sputtering method using the alloy target 5 comprising an alloy of Al, Mg, and Hf, a film can be formed on a wafer having a large size such as 6 inches or 8 inches with a uniform film thickness distribution and piezoelectric property distribution. Also for Sc-containing AlN, a target comprising an alloy of Sc and Al is used, but it is very expensive, and therefore, by using the alloy target 5 comprising an alloy of Al, Mg, and Hf, the product price can be significantly lowered.

The above sputtering is preferably performed with the temperature of the above substrate 1 being room temperature to 450° C.

(Piezoelectric Element)

A piezoelectric element according to the present invention comprises the piezoelectric thin film according to the present invention described above and first and second electrodes provided so as to be in contact with the above piezoelectric thin film. Specific embodiments using the piezoelectric element according to the present invention will be described below with reference to the drawings.

First Embodiment

Figure 5:
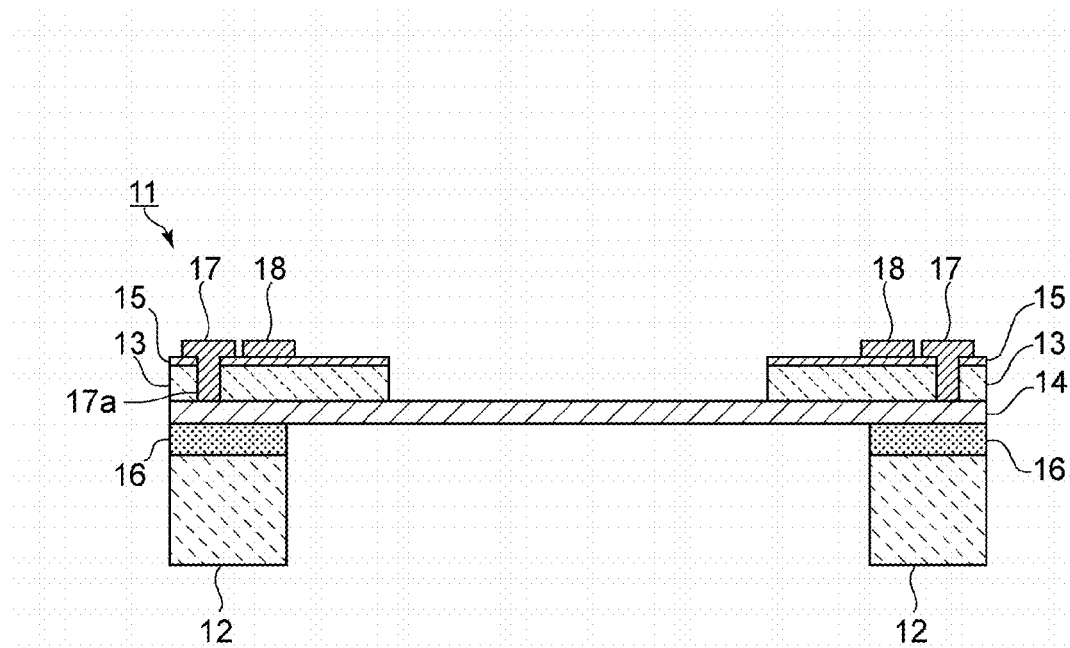
FIG. 5 is a cross-sectional view of a piezoelectric microphone that is a first embodiment using a piezoelectric element according to the present invention.

FIG. 5 is a cross-sectional view of a piezoelectric microphone 11 that is a first embodiment. The piezoelectric microphone 11 is composed of a cylindrical support 12, a silicon oxide film 16, first and second electrodes 14 and 15, a piezoelectric thin film 13, and first and second connection electrodes 17 and 18.

The cylindrical support 12 comprises an appropriate material such as high resistance silicon, glass, or GaAs. In this embodiment, the cylindrical support 12 comprises silicon. The silicon oxide film 16 is provided on the upper surface of the cylindrical support 12 so as to cover the cylindrical support 12.

The first electrode 14 is provided on the silicon oxide film 16. The first electrode 14 is disk-shaped. The first electrode 14 is provided so as to close the opening of the cylindrical support 12. In addition, the first electrode 14 is a portion that vibrates when sound pressure is externally applied.

The doughnut plate-shaped piezoelectric thin film 13 is provided on the first electrode 14. The second electrode 15 is provided on the upper surface of the piezoelectric thin film 13 so as to cover the piezoelectric thin film 13.

In the piezoelectric microphone 11 according to this embodiment, when the first electrode 14 vibrates by external sound pressure, the piezoelectric thin film 13 deforms. Then, in response to the deformation of the above piezoelectric thin film 13, an electrical signal according to the sound pressure can be obtained from the first and second electrodes 14 and 15.

The first and second connection electrodes 17 and 18 for connection to external electrodes are provided on the upper surface of the second electrode 15. The first connection electrode 17 has a via hole electrode portion 17a. The first connection electrode 17 is provided so as to be connected to the first electrode 14, and the second connection electrode 18 is provided so as to be connected to the second electrode 15.

In this embodiment, the first electrode 14 is composed of phosphorus-doped Si having a resistivity of 1.5 mΩ·cm or less. The second electrode 15 is composed of Al. The thickness of each material is not particularly limited. For example, in this embodiment, the first electrode 14 of 400 nm, the piezoelectric thin film 13 of 500 nm, and the second electrode 15 of 50 nm are used.

In addition, the above piezoelectric thin film 13 is the piezoelectric thin film 13 composed of AlN containing Mg and Hf according to the present invention described above. Therefore, the piezoelectric constant $d_{33}$ is larger than when AlN is used. Therefore, the sensitivity of the piezoelectric microphone 11 can be sufficiently increased.

Second Embodiment

Figure 6A:
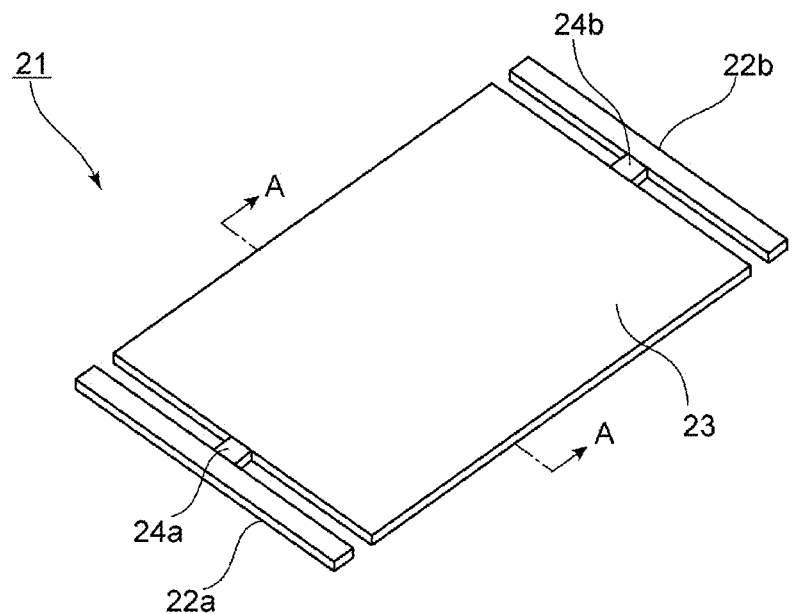
FIG. 6(*a*) is a perspective view of a width spreading vibrator that is a second embodiment using the piezoelectric element according to the present invention, and FIG. 6(*b*) is a cross-sectional view of the portion along line A-A in (a)
Figure 6B:
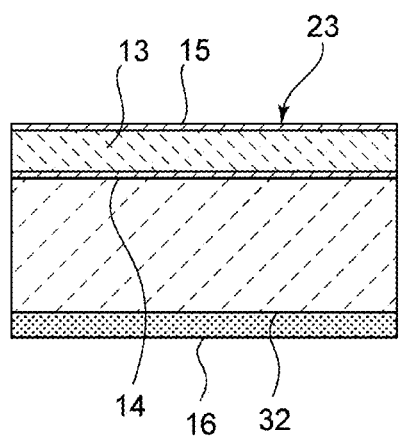

FIG. 6 (a) is a perspective view of a width spreading vibrator 21 that is a second embodiment. The width spreading vibrator 21 is a piezoelectric vibrator utilizing width spreading vibration. The above width spreading vibrator 21 comprises support portions 22a and 22b, a vibrating plate 23 as a vibrating body, and coupling portions 24a and 24b.

The vibrating plate 23 is rectangular plate-shaped and has a length direction and a width direction. The vibrating plate 23 is connected to the support portions 22a and 22b via the coupling portions 24a and 24b. In other words, the vibrating plate 23 is supported by the support portions 22a and 22b. The vibrating plate 23 is a vibrating body that vibrates in the width direction in a width spreading vibration mode when an alternating electric field is applied.

One ends of the coupling portions 24a and 24b are connected to the side surface centers on the sides of the short sides of the vibrating plate 23. The above side surface centers on the sides of the short sides of the vibrating plate 23 are nodes of width spreading vibration.

The support portions 22a and 22b are connected to the other ends of the coupling portions 24a and 24b. The support portions 22a and 22b extend on both sides of the coupling portions 24a and 24b. The length of the support portions 22a and 22b is not particularly limited, and is the same as the length of the short sides of the vibrating plate 23 in this embodiment.

FIG. 6 (b) is a cross-sectional view of the portion along line A-A in (a). As shown in FIG. 6 (b), the vibrating plate 23 is composed of a silicon oxide film 16, a substrate 32, first and second electrodes 14 and 15, and a piezoelectric thin film 13.

More specifically, the piezoelectric thin film 13 is provided on the substrate 32. The first and second electrodes 14 and 15 are provided so as to sandwich the piezoelectric thin film 13. The silicon oxide film 16 is provided below the substrate 32.

In this embodiment, the substrate 32 is an n-type Si layer with resistivity: 1 mΩ·cm and concentration: 7×10$^{19}$/cm$^3$.

A seed layer that is a protective layer, not shown, may be provided between the first electrode 14 and the second electrode 15.

In this embodiment, the first and second electrodes 14 and 15 are composed of Mo. The above seed layer is composed of AlN. The thickness of each material is not particularly limited. For example, in this embodiment, the substrate 32 of 10 μm, the silicon oxide film 16 of 400 nm, the first and second electrodes 14 and 15 of 100 nm, the piezoelectric thin film 13 of 1000 nm, the second electrode 15 of 50 nm, and the seed layer of 20 nm are used.

Also in the second embodiment, the above piezoelectric thin film 13 is composed of the piezoelectric thin film 13 comprising AlN containing Mg and Hf according to the present invention. Therefore, the piezoelectric constant $d_{33}$ is larger than when AlN is used. Therefore, a vibrator having a broadband and small resonant resistance can be formed. Therefore, a TCXO having a wide frequency variable range and low power consumption can be provided.

Third Embodiment

Figure 7:
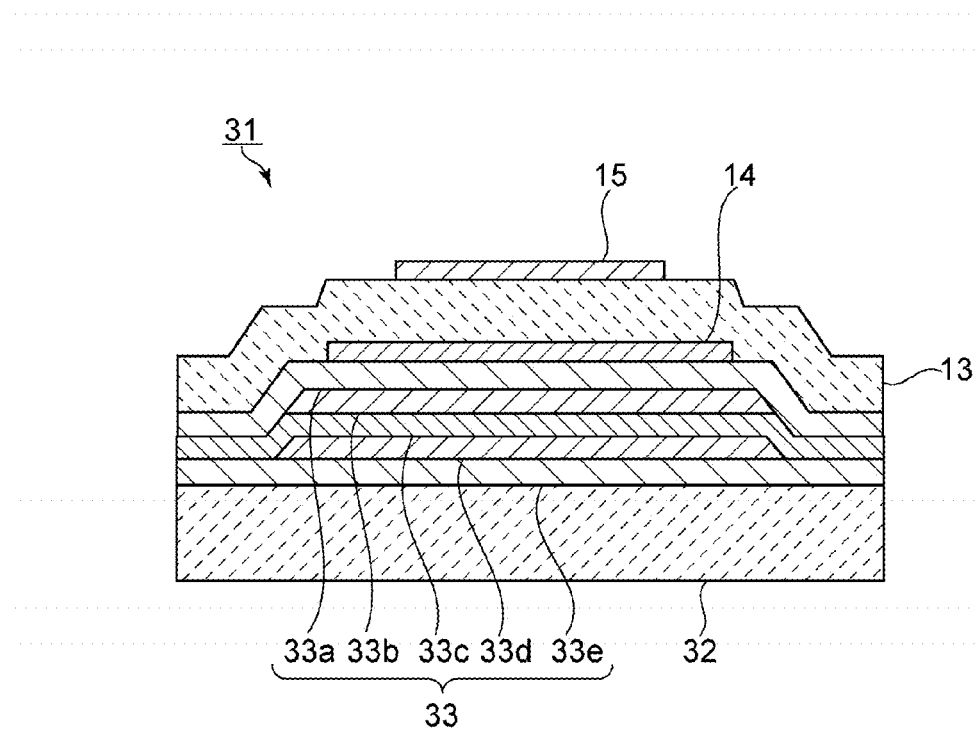
FIG. 7 is a cross-sectional view of a thickness longitudinal vibrator that is a third embodiment using the piezoelectric element of the present invention.

FIG. 7 shows a cross-sectional view of a thickness longitudinal vibrator 31 that is a third embodiment. The thickness longitudinal vibrator 31 is a piezoelectric vibrator having an acoustic reflection layer 33. The above thickness longitudinal vibrator 31 is composed of a substrate 32, the acoustic reflection layer 33, a piezoelectric thin film 13, and first and second electrodes 14 and 15.

The acoustic reflection layer 33 is provided on the upper surface of the substrate 32. The acoustic reflection layer 33 has a structure in which relatively high acoustic impedance layers 33b and 33d and relatively low acoustic impedance layers 33a, 33c, and 33e are alternately laminated.

The piezoelectric thin film 13 is provided on the acoustic reflection layer 33. The first and second electrodes 14 and 15 are provided so as to sandwich the piezoelectric thin film 13.

In this embodiment, the first and second electrodes 14 and 15 are composed of molybdenum. The above relatively high acoustic impedance layers 33b and 33d are composed of tungsten, and the above relatively low acoustic impedance layers 33a, 33c, and 33e are formed of silicon oxide.

Also in a known piezoelectric vibrator having such an acoustic reflection layer 33, by using the piezoelectric thin film 13 comprising AlN containing Mg and Hf according to the present invention, a filter/DPX that can achieve both a broadband and good temperature properties can be provided.

The piezoelectric element according to the present invention is not limited to the above-described first to third embodiments and can be used in various applications, for example, gyro sensors and acceleration sensors as high sensitivity sensors.

Next, a specific Experimental Example will be described.

Experimental Example

A film was formed by a ternary sputtering method under the following conditions using a first target comprising Al, a second target comprising Mg, and a third target comprising Hf.

Substrate temperature: 400° C.
Ar:N$_2$ gas ratio: 60:40
Gas pressure: 0.55 Pa
Composition: $Mg_{0.15}Hf_{0.23}Al_{0.62}N$ It was confirmed that the piezoelectric constant $d_{33}$ of the piezoelectric thin film obtained in Experimental Example was 11.2 pC/N and was sufficiently increased compared with the piezoelectric constant $d_{33}$ of AlN containing no Mg or Hf (6.5 pC/N).

REFERENCE SIGNS LIST

1 . . . substrate
2 . . . first target
3 . . . second target
4 . . . third target
5 . . . alloy target
11 . . . piezoelectric microphone
12 . . . cylindrical support
13 . . . piezoelectric thin film
14 . . . first electrode
15 . . . second electrode
16 . . . silicon oxide film
17 and 18 . . . first and second connection electrodes
17a . . . via hole electrode portion
21 . . . width spreading vibrator
22a, 22b . . . support portion
23 . . . vibrating plate
24a, 24b . . . coupling portion
31 . . . thickness longitudinal vibrator
32 . . . substrate
33 . . . acoustic reflection layer
33a, 33c, 33e . . . relatively low acoustic impedance layer
33b, 33d . . . relatively high acoustic impedance layer

What is claimed is:

1. A piezoelectric film comprising:
aluminum nitride containing magnesium and hafnium, wherein
a content of the hafnium based on 100 atomic % of the magnesium is in a range of 26 atomic % or more and 85 atomic % or less, and
a total content of the magnesium and hafnium based on a sum of a content of the magnesium, hafnium, and aluminum is in a range of 47 atomic % or less.

2. The piezoelectric film according to claim 1, wherein the total content of the magnesium and hafnium based on the sum of the content of the magnesium, hafnium, and aluminum is in a range of 17 atomic % or more and 38 atomic % or less.

3. A method for manufacturing the piezoelectric film according to claim 1, the method comprising forming a film by a ternary sputtering method using a first target comprising aluminum, a second target comprising magnesium, and a third target comprising hafnium.

4. The method for manufacturing the piezoelectric film according to claim 3, wherein the film is formed under a mixed atmosphere of nitrogen gas and argon gas.

5. The method for manufacturing the piezoelectric film according to claim 3, further comprising:
changing a ratio between a first target power of the first target, a second target power of the second target, and third target power of the third target so as to adjust a content of the aluminum, the magnesium, and the hafnium in the formed film.

6. The method for manufacturing the piezoelectric film according to claim 3, wherein the film is formed on a substrate, and a temperature of the substrate is from room temperature to 450° C.

7. A method for manufacturing the piezoelectric thin film according to claim 1, the method comprising:

forming a film by a unitary sputtering method using a target comprising an alloy of aluminum, magnesium, and hafnium.

8. The method for manufacturing the piezoelectric film according to claim 7, wherein the film is formed under a mixed atmosphere of nitrogen gas and argon gas.

9. The method for manufacturing the piezoelectric film according to claim 7, further comprising:
changing a content of the aluminum, the magnesium, and the hafnium in the alloy so as to adjust a content of the aluminum, the magnesium, and the hafnium in the formed film.

10. The method for manufacturing the piezoelectric film according to claim 7, wherein the film is formed on a substrate, and a temperature of the substrate is from room temperature to 450° C.

11. A piezoelectric element comprising:
the piezoelectric film according to claim 1; and
first and second electrodes in contact with the piezoelectric film.

12. The piezoelectric element according to claim 11, wherein
the first electrode is in contact with a first surface of the piezoelectric film, and
the second electrode is in contact with a second surface of the piezoelectric film, the second surface being opposite the first surface.

13. The piezoelectric element according to claim 11, further comprising:
an acoustic reflection layer adjacent one of the first and second electrodes.

* * * * *